(12) United States Patent
Kurakane

(10) Patent No.: US 7,340,624 B2
(45) Date of Patent: Mar. 4, 2008

(54) CLOCK CONTROL SYSTEM AND CLOCK CONTROL METHOD

(75) Inventor: Hiroshi Kurakane, Tokyo (JP)

(73) Assignee: NEC Corporation, Tokyo (JP)

(*) Notice: Subject to any disclaimer, the term of this patent is extended or adjusted under 35 U.S.C. 154(b) by 763 days.

(21) Appl. No.: 10/716,479

(22) Filed: Nov. 20, 2003

(65) Prior Publication Data

US 2004/0100310 A1 May 27, 2004

(30) Foreign Application Priority Data

Nov. 22, 2002 (JP) ............... 2002-339632

(51) Int. Cl.
*G06F 1/00* (2006.01)
(52) U.S. Cl. ............ 713/322; 713/320; 713/330; 713/340; 713/600
(58) Field of Classification Search ........ 713/320, 713/322, 300, 330, 340, 600, 500–501; 327/39, 327/114–116, 142, 158; 375/376; 331/16
See application file for complete search history.

(56) References Cited

U.S. PATENT DOCUMENTS 5,524,035 A * 6/1996 Casal et al. ............ 377/47
6,346,833 B1 * 2/2002 Kuroki ............... 327/119
6,771,100 B2 * 8/2004 Ishimi ............... 327/142
7,000,140 B2 * 2/2006 Okubo et al. ............ 713/601

FOREIGN PATENT DOCUMENTS

| JP | 2000-222061 A | 8/2000 |
| JP | 2000-347640 A | 12/2000 |
| JP | 2000-347762 A | 12/2000 |
| JP | 2001-296842 A | 10/2001 |
| JP | 2002-108490 A | 4/2002 |

* cited by examiner

*Primary Examiner*—T. B. Truong
(74) *Attorney, Agent, or Firm*—Sughrue Mion, PLLC

(57) ABSTRACT

This invention relates to a clock control system including a CPU, a peripheral functional block for the CPU, a frequency multiplication circuit which multiplies the frequency of an input system clock and outputs the multiplied system clock, a plurality of frequency division circuits which divide the frequency of a signal output from the frequency multiplication circuit to generate clocks to be supplied to the CPU and peripheral functional block, and a clock controller which changes the frequency multiplication ratio of the frequency multiplication circuit to 1/N (positive integer) and then changes the frequency division ratio of the frequency division circuit arranged on the input stage of the peripheral functional block to 1/N in order to set the CPU to a low-power consumption mode, and a method of controlling the clock control system.

8 Claims, 5 Drawing Sheets

CLOCK CONTROL SYSTEM AND CLOCK CONTROL METHOD

BACKGROUND OF THE INVENTION

1. Field of the Invention

The present invention relates to a clock control system and clock control method and, more particularly, to a clock control system and clock control method having a frequency multiplication circuit and frequency division circuit for various devices which incorporate a central processing unit (to be referred to as a CPU hereinafter) and a liquid crystal display (to be referred to as an LCD hereinafter) controller serving as a peripheral functional block, and constitute a portable information processing apparatus, portable communication apparatus, and the like.

2. Description of the Prior Art

Information processing apparatuses and communication apparatuses using digital circuits have conventionally adopted various digital circuits which operate by clocks, in order to realize various functions necessary for the information processing apparatuses and communication apparatuses. Each of devices which constitute information processing apparatuses and communication apparatuses also uses a plurality of digital circuits. The clock frequency supplied to a digital circuit often changes depending on the difference between the functions of functional blocks implemented by digital circuits. To drive digital circuits, various clock frequencies with difference frequencies are used.

In each of the devices of information processing apparatuses and communication apparatuses, the frequency of a clock (to be referred to as a system clock hereinafter) which is generated as a criterion by an oscillator arranged inside or outside the device is multiplied by a frequency multiplication circuit to generate a clock having a frequency higher than the frequencies of various clocks used in the device. In distributing the generated clock to various digital circuits used in various functional blocks in the device, the clock is divided into clocks having frequencies necessary for the respective digital circuits by frequency division circuits arranged on the input stages of the respective functional blocks. The resultant clocks are supplied to the digital circuits.

The above-described technique of temporarily multiplying the frequency of a system clock by a frequency multiplication circuit in an information processing apparatus or communication apparatus, dividing the frequency of a signal output from the frequency multiplication circuit by frequency division circuits to generate clocks having frequencies necessary for respective digital circuits, and then supplying the clocks to the digital circuits of functional blocks is disclosed in, e.g., Japanese Unexamined Patent Publication No. 2002-108490 (especially see the description on pp. 1 to 3 and in FIG. 2), or Japanese Unexamined Patent Publication No. 2001-296842 (especially see the description on pp. 1 to 3 and in FIG. 1).

The clock supply circuit technique disclosed in Japanese Unexamined Patent Publication No. 2002-108490 is related to a clock supply circuit which supplies clocks to a reception circuit and a processing circuit such as a digital signal processor (DSP) in, e.g., a digital broadcasting reception LSI, and particularly to a clock supply circuit which maintains synchronization with a transmission signal by switching the frequency of a clock supplied to a reception circuit in accordance with the step-out amount of a broadcasting signal, and switches the frequency of a clock supplied to a processing circuit in accordance with the load of the processing circuit or the like.

This technique has been developed as a clock supply circuit technique capable of simplifying the circuit arrangement of a clock supply circuit and realizing low power consumption by using a low-frequency external oscillator as a system clock generation source, temporarily multiplying the frequency of a signal output from the low-frequency external oscillator by a frequency multiplication circuit, then generating clocks having frequencies necessary for various functional circuits by frequency division using separate frequency division circuits, and supplying the clocks.

The technique disclosed in Japanese Unexamined Patent Publication No. 2001-296842 is a technique related to a signal generation apparatus which generates a signal (clock) for driving a liquid crystal display panel to display a video image. This technique is related to a signal generation apparatus which can realize stable operation and arbitrarily cope with the number of building pixels of a liquid crystal display panel to be driven.

The signal generation apparatus comprises a sync detection circuit which detects a horizontal sync signal in a video signal, and a frequency division circuit which, after a system clock is multiplied by a frequency multiplication circuit, divides the frequency of the clock by using the horizontal sync signal to generate a clock having an arbitrary frequency for driving the signal electrode of a liquid crystal panel.

In many cases, information processing apparatuses and communication apparatuses comprise a frequency multiplication circuit and frequency division circuit used in the above way in order to generate, from the frequency of a system clock, various clocks having different frequencies necessary for various digital circuits in various apparatuses.

A conventional clock frequency supply method having the frequency multiplication circuit and frequency division circuit in a device which incorporates a CPU and a peripheral functional block such as an LCD controller out of various devices used in apparatuses such as a portable information processing apparatus and portable communication apparatus will be explained.

Various devices which incorporate a CPU and a peripheral functional block such as an LCD controller and are used in various apparatuses such as a portable information processing apparatus and portable communication apparatus receive power from the batteries of the portable information processing apparatus and portable communication apparatus. To keep the operation time of the apparatus long, the CPU has a low-power consumption mode function, and supply of a system clock is stopped to stop the CPU, thus suppressing power consumption of the CPU. In addition, power consumption in a circuit for generating a system clock is reduced to achieve low power consumption.

In an apparatus using a device which incorporates a CPU having the low-power consumption mode function, the low-power consumption mode of the CPU is set, and supply of a system clock is stopped to stop CPU operation, thereby suppressing power consumption. The operation time of the apparatus can be kept long since power consumption is suppressed by stopping CPU operation.

When, however, a peripheral functional block such as an LCD controller must keep operating due to its functional role even if CPU operation stops, a clock to be supplied to the peripheral functional block must be generated from a system clock by a frequency multiplication circuit and a frequency division circuit on the input stage of the peripheral functional block in order to supply a clock to the peripheral functional block.

In general, a clock frequency necessary for the peripheral functional block often suffices to be lower than a clock frequency necessary for the CPU. A signal which is output from the frequency multiplication circuit to a frequency division circuit arranged on the input stage of the peripheral functional block is identical to a signal supplied to a frequency division circuit arranged on the input stage of the CPU. A signal whose frequency is unnecessarily high is supplied to the frequency division circuit arranged on the input stage of the peripheral functional block. The signal which is temporarily multiplied to an unnecessarily high frequency must be divided to a low frequency suitable for the peripheral functional block by the subsequent frequency division circuit. As the signal is multiplied to a high frequency by the frequency multiplication circuit, wasteful power consumption in the frequency multiplication circuit and frequency division circuit increases.

In the conventional clock control system and clock control method, a clock frequency necessary for the peripheral functional block often suffices to be lower than a clock frequency necessary for the CPU. A signal which is output from the frequency multiplication circuit to a frequency division circuit arranged on the input stage of the peripheral functional block is identical to a signal supplied to a frequency division circuit arranged on the input stage of the CPU. A signal whose frequency is unnecessarily high is supplied to the frequency division circuit arranged on the input stage of the peripheral functional block. The signal which is temporarily multiplied to an unnecessarily high frequency must be divided to a low frequency suitable for the peripheral functional block by the subsequent frequency division circuit. As the signal is multiplied to a high frequency by the frequency multiplication circuit, wasteful power consumption in the frequency multiplication circuit and frequency division circuit increases.

SUMMARY OF THE INVENTION

It is an object of the present invention to provide a clock control system and method in which the frequency of a signal supplied to a frequency division circuit arranged on the input stage of a peripheral functional block can be set lower than a frequency in the normal mode state of a CPU, and power consumption necessary to generate a clock to be supplied to the peripheral functional block can be suppressed lower than the conventional one.

To achieve the above object, according to the first aspect of the present invention, there is provided a clock control system comprising a CPU, a peripheral functional block for the CPU, a frequency multiplication circuit which multiplies a frequency of an input system clock and outputs the multiplied system clock, a first frequency division circuit which divides a frequency of a signal output from the frequency multiplication circuit to generate a first clock to be supplied to the CPU, a second frequency division circuit which divides the frequency of the signal output from the frequency multiplication circuit to generate a second clock to be supplied to the peripheral functional block, and a clock controller which changes a frequency multiplication ratio of the frequency multiplication circuit to 1/N (positive integer) and then changes a frequency division ratio of the frequency division circuit arranged on an input stage of the peripheral functional block to 1/N in order to set the CPU to a low-power consumption mode using no first clock.

According to the second aspect of the present invention, there is provided a clock control system wherein in order to cancel the low-power consumption mode of the CPU, the clock controller in the clock control system defined in the first aspect changes N times the frequency division ratio of the frequency division circuit arranged on the input stage of the peripheral functional block, and then changes N times the frequency multiplication ratio of the frequency multiplication circuit.

To achieve the above object, according to the third aspect of the present invention, there is provided a clock control method in a clock control system which has a CPU, a peripheral functional block for the CPU, and a frequency multiplication circuit and a plurality of frequency division circuits that generate clocks to be supplied to the CPU and the peripheral functional block, and in which a frequency of an input system clock is multiplied by the frequency multiplication circuit and divided by the frequency division circuits, and clocks are supplied to the CPU and the peripheral functional block, comprising, in order to set the CPU to a low-power consumption mode using no CPU clock, the step of changing a frequency multiplication ratio of the frequency multiplication circuit to 1/N (positive integer), and the subsequent step of changing a frequency division ratio of the frequency division circuit arranged on an input stage of the peripheral functional block to 1/N.

According to the fourth aspect of the present invention, there is provided a clock control method wherein in order to cancel the low-power consumption mode of the CPU, the clock control method defined in the third aspect further comprises the step of changing N times the frequency division ratio of the frequency division circuit arranged on the input stage of the peripheral functional block, and the subsequent, step of changing N times the frequency multiplication ratio of the frequency multiplication circuit.

According to the fifth aspect of the present invention, there is provided a clock control method in a clock control system which has a CPU, a peripheral functional block for the CPU, a frequency multiplication circuit and a plurality of frequency division circuits that generate clocks to be used for the CPU and the peripheral functional block, and a controller that controls the CPU, the frequency multiplication circuit, and the frequency division circuits, and in which a frequency of an input system clock is multiplied by the frequency multiplication circuit, a signal output from the frequency multiplication circuit is input to the plurality of frequency division circuits, a frequency of the output signal is divided by a first frequency division circuit to supply the output signal as a CPU clock to the CPU, and the frequency of the signal output from the frequency multiplication circuit is divided by a second frequency division circuit to supply the output signal as a peripheral functional block clock to the peripheral functional block, comprising, in order to set the CPU to a low-power consumption mode using no CPU clock, the step of changing a frequency multiplication ratio of the frequency multiplication circuit to 1/N (positive integer) via the controller, and the subsequent step of changing a frequency division ratio of the second frequency division circuit arranged on an input stage of the peripheral functional block to 1/N via the controller.

According to the sixth aspect of the present invention, there is provided a clock control method wherein in order to cancel the low-power consumption mode of the CPU, the clock control method defined in the fifth aspect further comprises the step of changing N times the frequency division ratio of the second frequency division circuit arranged on the input stage of the peripheral functional block via the controller, and the subsequent step of changing N times the frequency multiplication ratio of the frequency multiplication circuit via the controller.

According to the seventh aspect of the present invention, there is provided a clock control method in a clock control system which has a CPU, a peripheral functional block for the CPU, a frequency multiplication circuit and a plurality of frequency division circuits that generate clocks to be used for the CPU and the peripheral functional block, and a controller that controls operations of the frequency multiplication circuit and the frequency division circuits, and in which a frequency of an input system clock is multiplied by the frequency multiplication circuit, the multiplied frequency is input to the plurality of frequency division circuits connected as first and second frequency division circuits to input stages of the CPU and the peripheral functional block, a frequency of a signal output from the frequency multiplication circuit is divided by the first frequency division circuit to supply the signal as a CPU clock to the CPU, the frequency of the signal output from the frequency multiplication circuit is divided by the second frequency division circuit to supply the signal as a peripheral functional block clock to the peripheral functional block, comprising, in order to set the CPU to a low-power consumption mode, the step of confirming whether the peripheral functional block keeps operating, on the basis of whether the controller has received a second clock stop enable signal output from the peripheral functional block when the controller receives a first clock stop enable signal output from the CPU, the step of determining that the peripheral functional block keeps operating when the controller has not received the second clock stop enable signal output from the peripheral functional block, the step of changing a frequency multiplication ratio of the frequency multiplication circuit to 1/N (positive integer) via the controller, and the subsequent step of changing a frequency division ratio of the second frequency division circuit arranged on the input stage of the peripheral functional block to 1/N via the controller.

According to the eighth aspect of the present invention, there is provided a clock control method wherein in order to cancel the low-power consumption mode of the CPU, the clock control method defined in the seventh aspect further comprises the step of confirming whether the peripheral functional block keeps operating, on the basis of whether the controller has received the second clock stop enable signal output from the peripheral functional block when the controller does not receive the first clock stop enable signal output from the CPU, the step of determining that the peripheral functional block keeps operating when the controller has not received the second clock stop enable signal output from the peripheral functional block, the step of changing N times the frequency division ratio of the second frequency division circuit arranged on the input stage of the peripheral functional block via the controller, and the subsequent step of changing N times the frequency multiplication ratio of the frequency multiplication circuit via the controller.

As is apparent from the above aspects, in the clock control system and method of the present invention, the frequency of a signal output from the frequency multiplication circuit is changed to a lower frequency in setting the CPU to the low-power consumption mode. For this purpose, the frequency multiplication ratio of the frequency multiplication circuit is changed to a small value, and the frequency division ratio of the frequency division circuit arranged on the input stage of a peripheral functional block such as an LCD controller is changed to a small value by an amount of changing the frequency multiplication ratio of the frequency multiplication circuit to a small value. With this arrangement, in the low-power consumption mode of the CPU, the frequency of a signal supplied from the frequency multiplication circuit to the frequency division circuit arranged on the input stage of the peripheral functional block can be set lower than a frequency in the normal mode state of the CPU. Power consumption required to generate a clock to be supplied to the peripheral functional block can be suppressed lower than the conventional one.

DETAILED DESCRIPTION OF THE PREFERRED EMBODIMENTS

Several preferred embodiments of the present invention will be described below with reference to the accompanying drawings.

Figure 1:
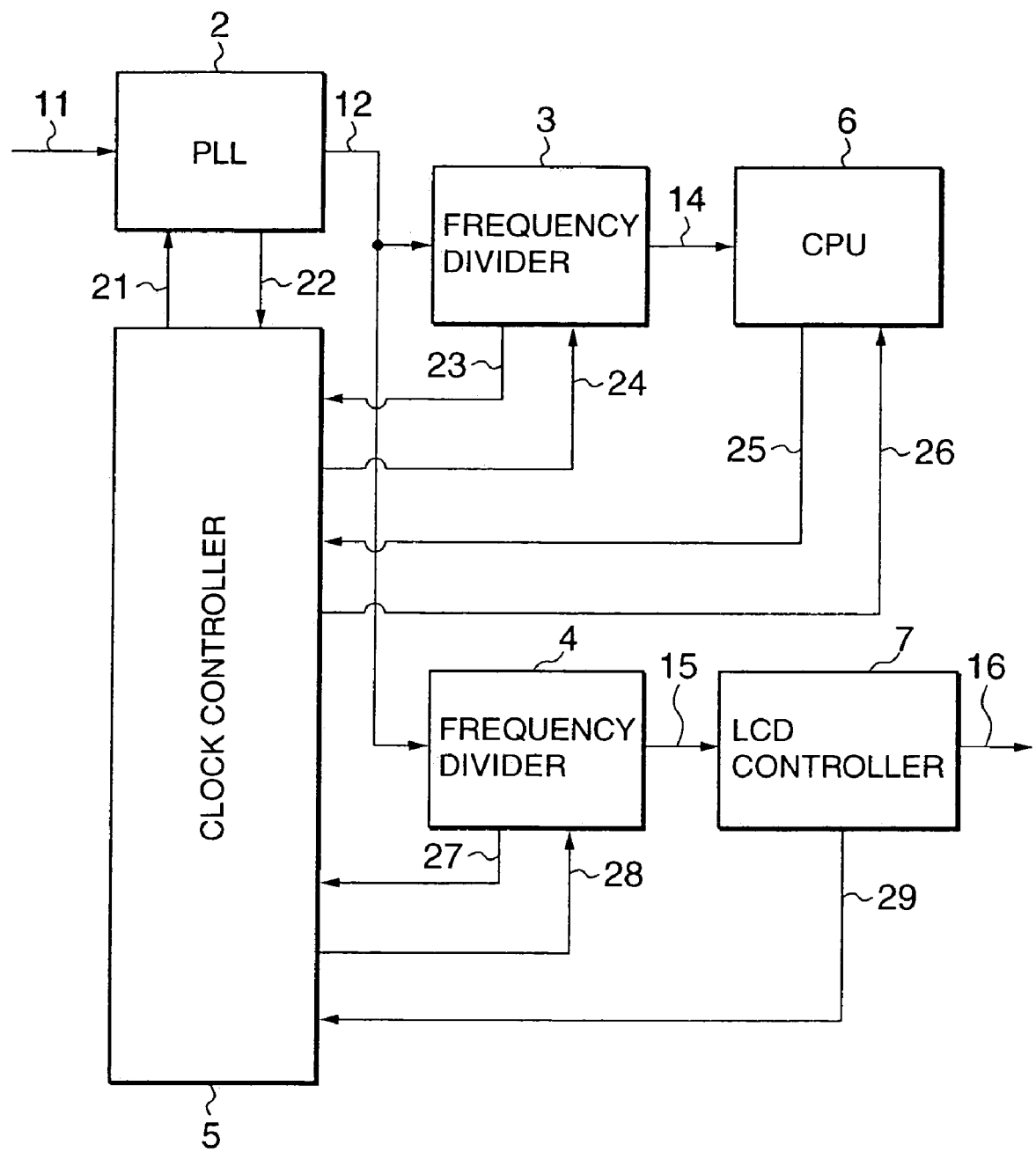
FIG. 1 is a block diagram showing the whole schematic arrangement of a clock control system according to an embodiment of the present invention.

A clock control system of the present invention shown in FIG. 1 is mounted in a device used in various apparatuses such as a portable information processing apparatus and portable communication apparatus. When a CPU which performs various information/data processes required out of various functions in the portable information processing apparatus, portable communication apparatus, and the like is set to a low-power consumption mode using no clock, whether an LCD controller serving as a peripheral functional block of the CPU keeps operating is determined. If the LCD controller keeps operating, the frequency multiplication ratio of a PLL (Phase-Locked Loop) which operates as a frequency multiplication circuit is decreased to, e.g., 1/N (N is a predetermined value (positive integer)) to set the frequency of a clock output from the PLL to a low frequency. Also, the frequency division ratio of a frequency divider which operates as a frequency division circuit on the input stage of the LCD controller kept operating is decreased to 1/N. In this manner, both the frequency multiplication ratio and frequency division ratio are changed. At this time, the frequency multiplication ratio and frequency division ratio are so changed as not to change a value "frequency multiplication ratio/frequency division ratio" serving as the raito of the frequency multiplication ratio value to the frequency division ratio value before and after changing the frequency multiplication ratio and frequency division ratio.

In other words, according to the present invention, settings are changed such that the frequency multiplication ratio of the PLL is decreased, and then the frequency division ratio of the frequency divider is decreased at the same ratio. Although the frequency of a clock input to the peripheral functional block does not change, the frequency of a signal output from the PLL can be decreased by decreasing the frequency multiplication ratio of the PLL. Power consumption in the PLL and frequency divider can, therefore, be suppressed.

FIG. 1 shows a clock control system in which an LCD controller serving as a peripheral functional block is mounted in a device together with a CPU.

The clock control system shown in FIG. 1 is constituted by a CPU 6 which is mounted in a device used in various apparatuses such as a portable information processing apparatus and portable communication apparatus and performs various information/data processes in the portable information processing apparatus, portable communication apparatus, and the like, an LCD controller 7 which is a peripheral functional block connected to the input/output device (not shown) of the CPU 6, receives a clock 15 output from a frequency divider 4, and outputs a pixel clock 16 to an LCD (not shown), a PLL 2 which multiplies the frequency of an input system clock 11 at a frequency multiplication ratio set by a clock controller 5 (to be described later) and outputs the resultant signal as a PLL output signal 12, a frequency divider 3 which divides the frequency of the PLL output signal 12 output from the PLL 2 at a frequency division ratio set by the clock controller 5 (to be described later), generates a clock 14, and outputs the clock 14 to the CPU 6, the frequency divider 4 which divides the frequency of the PLL output signal 12 output from the PLL 2 at a frequency division ratio set by the clock controller 5 (to be described later), generates the clock 15, and outputs the clock 15 to the LCD controller 7, and the clock controller 5 which controls and monitors the PLL 2 by a PLL control signal 21 and PLL state monitoring signal 22, controls and monitors the frequency divider 3 by a frequency division ratio control signal 24 and frequency divider state monitoring signal 23, controls and monitors the frequency divider 4 by a frequency division ratio control signal 28 and frequency divider state monitoring signal 27, receives a clock stop enable signal 25 from the CPU 6, starts setting/cancellation control of a low-power consumption mode to the CPU 6, and controls setting/cancellation of the low-power consumption mode to the CPU 6 by a CPU control signal 26, and receives a clock stop enable signal 29 from the LCD controller 7.

The operation of the clock control system having the above arrangement will be explained.

An operation of setting the low-power consumption mode of the CPU 6 will be described.

Figure 2:
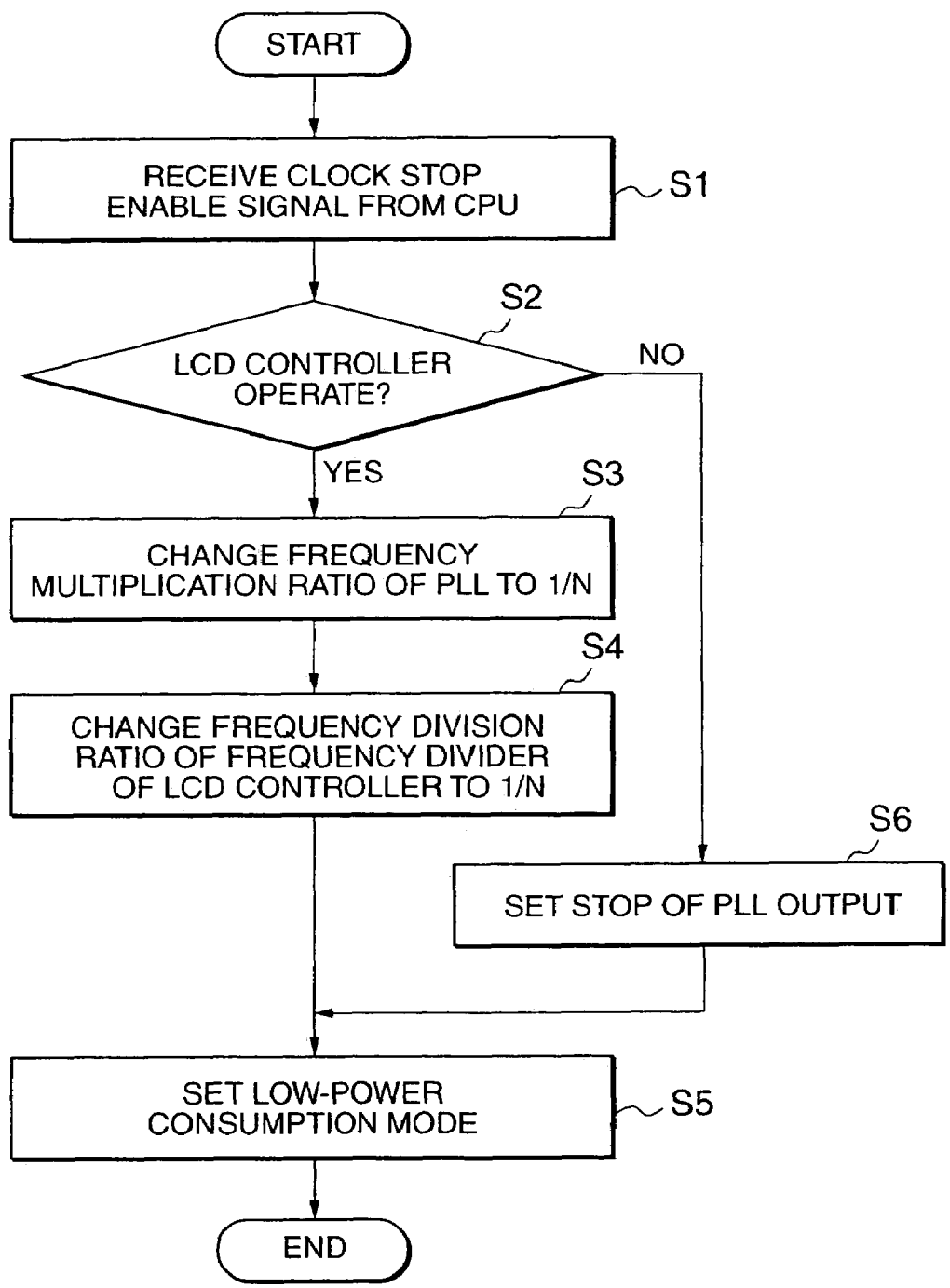
FIG. 2 is a flow chart showing an operation example of setting a CPU to a low-power consumption mode in the clock control system shown in FIG. 1.

FIG. 2 is a flow chart showing an operation example of setting the CPU to the low-power consumption mode in the clock control system of the present invention shown in FIG. 1.

In FIG. 1, the clock controller 5 detects whether the CPU 6 requires the clock 14, on the basis of reception/non-reception of the clock stop enable signal 25 output from the CPU 6. That is, if the clock controller 5 receives the clock stop enable signal 25 output from the CPU 6 (S1 in FIG. 2), the clock controller 5 detects that the CPU 6 does not require the clock 14.

The clock controller 5 which has detected that the CPU 6 does not require the clock 14 confirms whether the LCD controller 7 serving as a peripheral functional block operates for LCD display, on the basis of reception/non-reception of the clock stop enable signal 29 from the LCD controller 7 (S2).

If the clock controller 5 confirms in step 2 whether the LCD controller 7 operates for LCD display, and has not received the clock stop enable signal 29 from the LCD controller 7, that is, the clock controller 5 confirms that the LCD is in the display state while the LCD controller 7 keeps operating, the clock controller 5 sends the PLL control signal 21 to the PLL 2, changes settings by decreasing the frequency multiplication ratio of the PLL 2 to a predetermined frequency multiplication ratio, e.g., 1/N, and thereby set the frequency of a signal output from the PLL 2 to a low frequency. The PLL 2 notifies the clock controller 5 by the PLL state monitoring signal 22 of the result of changing the frequency multiplication ratio of the PLL 2 (S3).

After that, the clock controller 5 sends the frequency division ratio control signal 28 to the frequency divider 4 arranged on the input stage of the LCD controller 7, and changes the frequency division ratio by decreasing the frequency division ratio of the frequency divider 4 to 1/N in correspondence with the setting change of the frequency multiplication ratio of the PLL 2. The frequency of the clock 15 supplied to the LCD controller 7 that has temporarily become a low frequency by the setting change of the frequency multiplication ratio of the PLL 2 is returned to a previous frequency. The frequency divider 4 notifies the clock controller 5 by the frequency divider state monitoring signal 27 of the result of changing the frequency division ratio of the frequency divider 4 (S4).

After the clock controller 5 changes the frequency multiplication ratio of the PLL 2 and the frequency division ratio of the frequency divider 4, the clock controller 5 outputs the CPU control signal 26 to the CPU 6 to set the CPU 6 to the low-power consumption mode (S5).

As described above, both the frequency multiplication ratio of the PLL 2 and the frequency division ratio of the frequency divider 4 are changed to predetermined values, e.g., 1/N in the above example. The frequency of a signal output from the PLL 2 can be decreased to a predetermined low frequency while the frequency of a clock output from the frequency divider 4 to the LCD controller 7 remains the same as a frequency set before both the frequency multiplication ratio and frequency division ratio are changed.

When the low-power consumption mode of the CPU 6 is canceled, the frequency multiplication ratio of the PLL 2 must be changed first in changing the frequency multiplication ratio of the PLL 2 and the frequency division ratio of the frequency divider 4. If the frequency division ratio is decreased in an order opposite to the above-described order before decreasing the frequency multiplication ratio, the frequency of the clock 15 input to the LCD controller 7 temporarily increases, and the LCD controller 7 may fail to operate normally.

If the clock controller 5 confirms in step 2 whether the LCD controller 7 operates for LCD display, and has received the clock stop enable signal 29 from the LCD controller 7, that is, the clock controller 5 confirms that the LCD controller 7 does not operate for LCD display, the clock controller 5 performs output stop setting control of stopping an output from the PLL 2 (S6), and outputs the CPU control signal 26 to the CPU 6 to set the CPU 6 to the low-power consumption mode (S5).

If the clock controller 5 receives the clock stop enable signal 29 from the LCD controller 7 after the frequency multiplication ratio of the PLL 2 and the frequency division ratio of the frequency divider 4 are changed in steps 3 and 4 and the low-power consumption mode of the CPU 6 is set in step 5, the clock controller 5 outputs the frequency division ratio control signal 28 to the frequency divider 4, and resets the setting change of the frequency division ratio of the frequency divider 4 that has been executed in step 4 for the frequency divider 4, i.e., sets the frequency division ratio N times. The clock controller 5 then outputs the PLL control signal 21 to the PLL 2, and resets the setting change of the frequency multiplication ratio of the PLL 2 that has been executed in step 3 for the PLL 2, i.e., sets the frequency multiplication ratio N times. Further, the clock controller 5 performs PLL output stop setting.

An operation of canceling the low-power consumption mode of the CPU 6 will be described.

Figure 3:
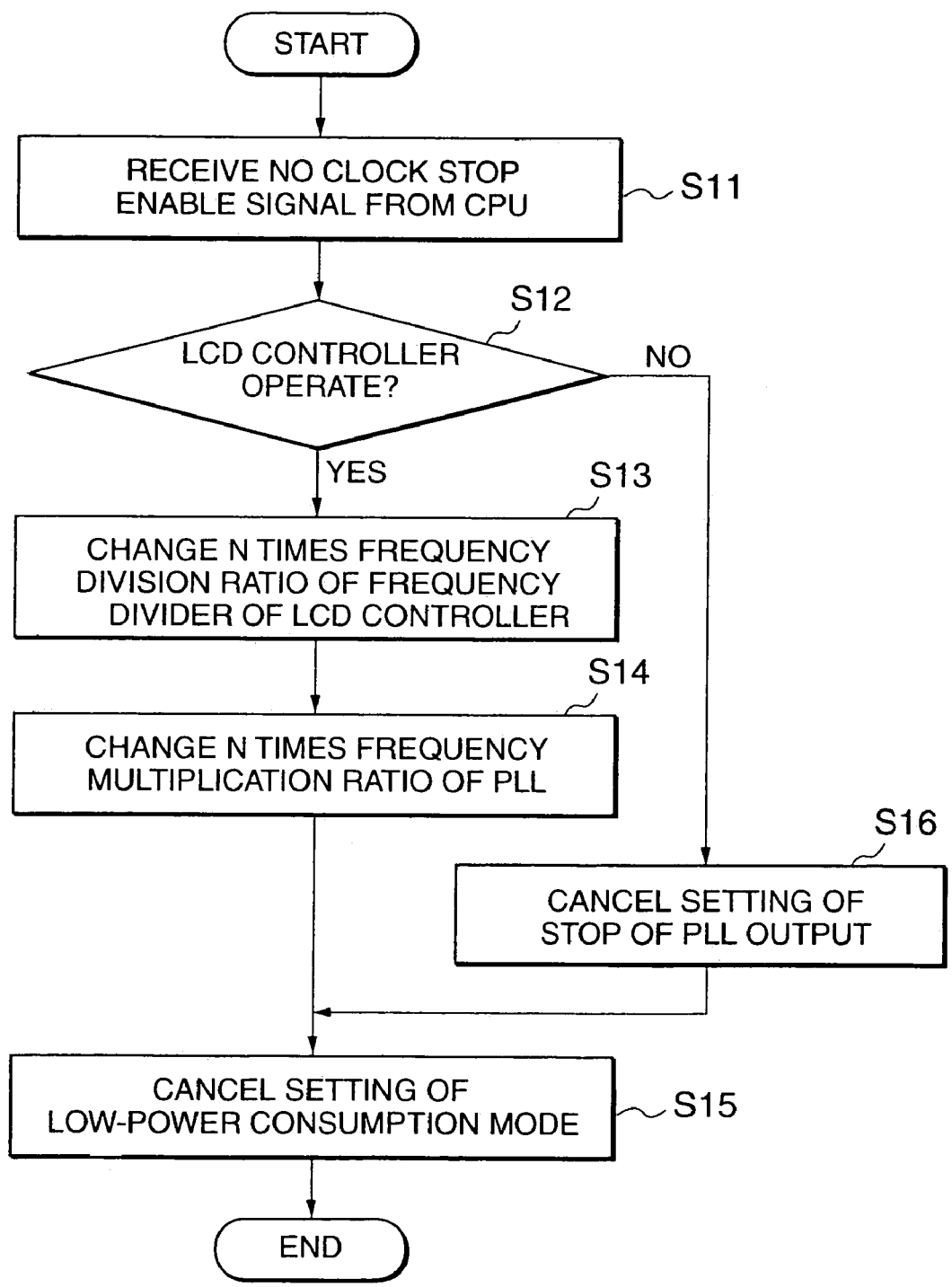
FIG. 3 is a flow chart showing an, operation example of canceling setting of the low-power consumption mode of the CPU in the clock control system shown in FIG. 1.

FIG. 3 is a flow chart showing an operation example of canceling setting of the low-power consumption mode of the CPU in the clock control system shown in FIG. 1.

In the operation flow shown in FIG. 3, the low-power consumption mode of the CPU 6 shown in FIG. 1 is set and maintained.

In this state, if the clock controller 5 does not receive the clock stop enable signal 25 output from the CPU 6 (S11), the clock controller 5 detects that the CPU 6 requires the clock 14, and confirms whether the LCD controller 7 operates for LCD display, on the basis of reception/non-reception of the clock stop enable signal 29 from the LCD controller 7 (S12). If the clock controller 5 confirms in step 12 whether the LCD controller 7 operates for LCD display, and has not received the clock stop enable signal 29 from the LCD controller 7, i.e., the clock controller 5 confirms that the LCD controller 7 operates for LCD display, the clock controller 5 sends the frequency division ratio control signal 28 to the frequency divider 4 arranged on the input stage of the LCD controller 7, and changes settings by increasing N times the frequency division ratio of the frequency divider 4 at this time, reversely to setting of the low-power consumption mode. The frequency divider 4 notifies the clock controller 5 by the frequency divider state monitoring signal 27 of the result of changing the frequency division ratio of the frequency divider 4 (S13).

The clock controller 5 sends the PLL control signal 21 to the PLL 2, and changes settings by increasing N times the frequency multiplication ratio of the PLL 2 at this time, reversely to setting of the low-power consumption mode. The frequency of a signal output from the PLL 2 is returned to a predetermined frequency, i.e., a frequency set before the low-power consumption mode of the CPU is set. The PLL 2 notifies the clock controller 5 by the PLL state monitoring signal 22 of the result of changing the frequency multiplication ratio of the PLL 2 (S14).

After the clock controller 5 changes the frequency multiplication ratio of the PLL 2 and the frequency division ratio of the frequency divider 4, the clock controller 5 outputs the CPU control signal 26 to the CPU 6 to cancel setting of the low-power consumption mode of the CPU 6 (S15).

If the clock controller 5 confirms in step 12 whether the LCD controller 7 operates for LCD display, and confirms reception of the clock stop enable signal 29 from the LCD controller 7, an output from the PLL 2 is stopped, and the clock controller 5 has already reset the setting change of the frequency multiplication ratio of the PLL 2 that has been performed in step 3 and the setting change of the frequency division ratio of the frequency divider 4 that has been performed in step 4. The clock controller 5 sends directly to the PLL 2 the PLL control signal 21 for performing control of canceling output stop setting, and performs control of canceling output stop setting for the PLL 2 (S16). The clock controller 5 outputs the CPU control signal 26 to the CPU 6 to cancel setting of the low-power consumption mode of the CPU 6 (S15).

In canceling the low-power consumption mode, both the frequency multiplication ratio of the PLL 2 and the frequency division ratio of the frequency divider 4 are changed N times. Consequently, the frequency multiplication ratio of the PLL 2 and the frequency division ratio of the frequency divider 4 are returned to values set before the low-power consumption mode is set. The frequency of a clock input to the LCD controller 7 returns to -a frequency set before the frequency multiplication ratio and frequency division ratio are changed. The frequency of a signal output from the PLL 2 is returned to a frequency set before the low-power consumption mode of the CPU is set.

In this manner, in canceling the low-power consumption mode of the CPU 6, whether the LCD controller 7 operates for LCD display is confirmed. When the LCD controller 7 can operate for LCD display, the frequency division ratio of the frequency divider 4 is increased, and then the frequency multiplication ratio of the PLL 2 is increased. That is, the frequency multiplication ratio of the PLL 2 and the frequency division ratio of the frequency divider 4 are changed in an order opposite to an order of changing the frequency multiplication ratio of the PLL 2 and the frequency division ratio of the frequency divider 4 when the low-power consumption mode of the CPU 6 is set. The frequency division ratio of the frequency divider 4 is first changed, and then the frequency multiplication ratio of the PLL 2 is changed.

As described above, according to the present invention, the frequency multiplication ratio of the PLL 2 is changed to a predetermined small value, and the frequency division ratio of the frequency divider 4 arranged on the input stage of the LCD controller 7 is changed to a small value at the same ratio as that used to change the frequency multiplication ratio of the PLL 2 to a small value. In the low-power consumption mode state of the CPU, the frequency of a signal supplied to the frequency divider 4 arranged on the input stage of the LCD controller 7 can be set lower than a frequency in the normal mode state of the CPU 6 without changing the frequency of the clock 15 output from the frequency divider 4 to the LCD controller 7. Power consumption necessary to generate a clock to be supplied to the LCD controller 7 can be suppressed lower than the conventional one.

Some peripheral functional blocks steadily output signals such as a clock in operation. For example, the LCD controller 7 shown in FIG. 1 is one of such peripheral functional blocks, and a peripheral block such as the LCD controller 7 steadily outputs the pixel clock 16 in operation. If the frequency of a clock such as a pixel clock output from a peripheral functional block such as the LCD controller 7 is changed while the clock is output from the peripheral functional block, a partner apparatus which receives supply of the clock may malfunction.

When the LCD controller 7 outputs a pixel clock, i.e., the frequency of a clock supplied to the LCD controller 7 shown in FIG. 1 varies, the influence on the operation of a partner apparatus (LCD) which receives supply of the pixel clock output from the LCD controller 7 can be prevented by stopping and restarting a clock supplied to the LCD controller 7 before and after changing the frequency multiplication ratio and frequency division ratio. This operation flow is shown in FIGS. 4 and 5.

Figure 4:
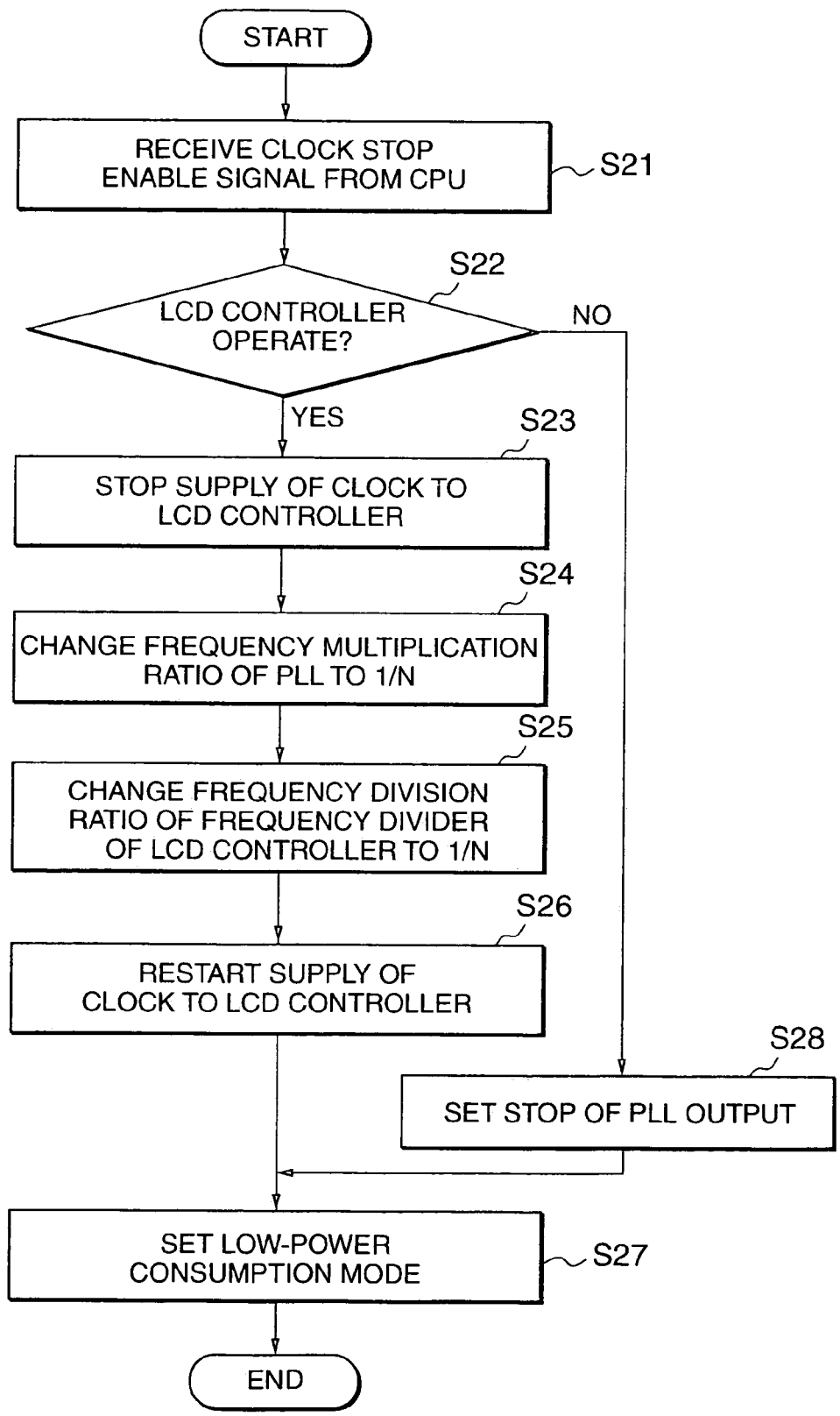
FIG. 4 is a flow chart showing another operation example of setting the CPU to the low-power consumption mode in the clock control system shown in FIG. 1.

FIG. 4 is a flow chart showing another operation example of setting the CPU to the low-power consumption mode in the clock control system shown in FIG. 1. FIG. 5 is a flow chart showing another operation example of canceling setting of the low-power consumption mode of the CPU in the clock control system shown in FIG. 1.

Figure 5:
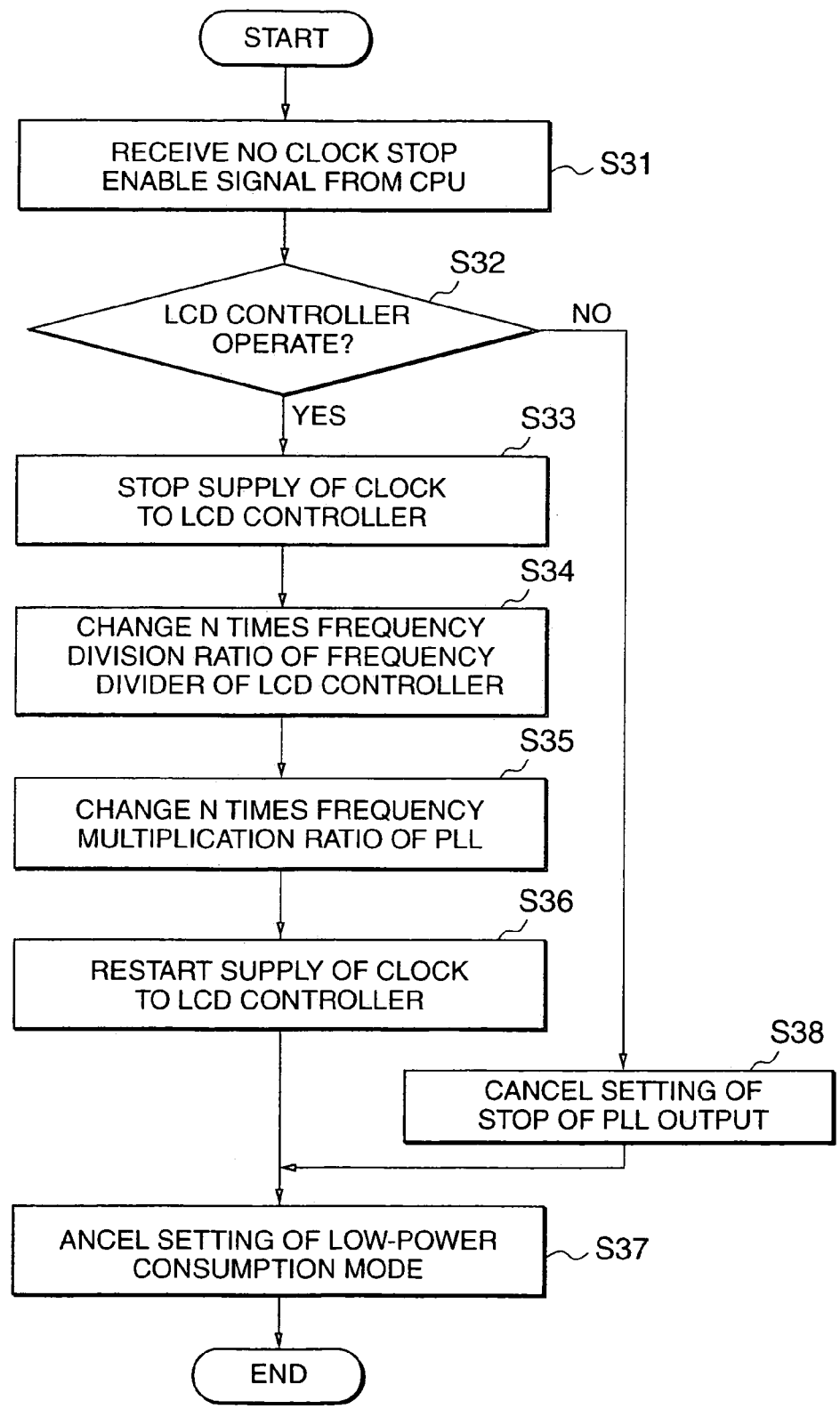
FIG. 5 is a flow chart showing another operation example of canceling setting of the low-power consumption mode of the CPU in the clock control system shown in FIG. 1.

Similar to FIGS. 2 and 3, FIGS. 4 and 5 show a case wherein the target peripheral functional block is the LCD controller 7. FIGS. 4 and 5 are flow charts showing an operation flow of preventing the influence on the operation of a partner apparatus which receives supply of a pixel clock output from the LCD controller 7.

The flow charts shown in FIGS. 4 and 5 are different from those shown in FIGS. 2 and 3 in that operations of stopping and restarting the clock 15 supplied to the LCD controller 7 before and after changing the frequency multiplication ratio and frequency division ratio are inserted as steps 23, 26, 33, and 36 in the operation flow. The flow charts shown in FIGS. 2 and .3 do not consider the influence of changing the frequencies of the PLL 2 and frequency divider 4 on the operation of a partner apparatus (LCD) which receives supply of a pixel clock output from the LCD controller 7.

In FIGS. 4 and 5, output of a pixel clock from the LCD controller 7 stops in steps 23 and 33, and output of a pixel clock from the LCD controller 7 restarts in steps 26 and 36.

In the above description of the clock control system of the present invention shown in FIG. 1, the LCD controller 7 connected to an LCD (not shown) has been exemplified as a peripheral functional block. However, the peripheral functional block in the clock control system of the present invention is not limited to the LCD controller.

In the above description, the clock stop enable signal 25 and clock stop enable signal 29 which are sent from the CPU 6 and LCD controller 7 to the clock controller 5 are successively sent to the clock controller 5. Instead of successive signals, a clock stop enable signal for enabling stop of a clock may be sent once to the clock controller 5 when stop of a clock is enabled, and a clock stop disable signal for disabling stop of a clock may be sent when stop of a clock is disabled.

What is claimed is:

1. A clock control system comprising:
   a CPU;
   a peripheral functional block for said CPU;
   a frequency multiplication circuit which multiplies a frequency of an input system clock and outputs the multiplied system clock;
   a first frequency division circuit which divides a frequency of a signal output from said frequency multiplication circuit to generate a first clock to be supplied to said CPU;
   a second frequency division circuit which divides the frequency of the signal output from said frequency multiplication circuit to generate a second clock to be supplied to said peripheral functional block; and
   clock control means for changing a frequency multiplication ratio of said frequency multiplication circuit to 1/N and then changing a frequency division ratio of said second frequency division circuit to 1/N in order to set said CPU to a low-power consumption mode using no first clock,
   wherein N is a positive integer.

2. A system according to claim 1, wherein in order to cancel the low-power consumption mode of said CPU, said clock control means changes N times the frequency division ratio of said second frequency division circuit and then changes N times the frequency multiplication ratio of said frequency multiplication circuit.

3. A clock control method in a clock control system, the clock control system comprising a CPU, a peripheral functional block for the CPU, and a frequency multiplication circuit and a plurality of frequency division circuits that generate clocks to be supplied to the CPU and the peripheral functional block, wherein a frequency of an input system clock is multiplied by the frequency multiplication circuit and divided by the frequency division circuits, and clocks are supplied to the CPU and the peripheral functional block, the method comprising, in order to set the CPU to a low-power consumption mode using no CPU clock:
   changing a frequency multiplication ratio of the frequency multiplication circuit to 1/N; and
   subsequently changing a frequency division ratio of the frequency division circuit arranged on an input stage of the peripheral functional block to 1/N,
   wherein N is a positive integer.

4. A method according to claim 3, further comprising:
   in order to cancel the low-power consumption mode of the CPU, changing N times the frequency division ratio of the frequency division circuit arranged on the input stage of the peripheral functional block; and
   subsequently changing N times the frequency multiplication ratio of the frequency multiplication circuit.

5. A clock control method in a clock control system, the clock control system comprising a CPU, a peripheral functional block for the CPU, a frequency multiplication circuit and a plurality of frequency division circuits that generate clocks to be used for the CPU and the peripheral functional block, and control means for controlling the CPU, the frequency multiplication circuit, and frequency division circuits, wherein a frequency of an input system clock is multiplied by the frequency multiplication circuit, a signal output from the frequency multiplication circuit is input to the plurality of frequency division circuits, a frequency of the output signal is divided by a first frequency division circuit to supply the output signal as a CPU clock to the CPU, and the frequency of the signal output from the frequency multiplication circuit is divided by a second frequency division circuit to supply the output signal as a peripheral functional block clock to the peripheral functional block, said method comprising, in order to set the CPU to a low-power consumption mode using no CPU clock:
   changing a frequency multiplication ratio of the frequency multiplication circuit to 1/N via the control means; and
   subsequently changing a frequency division ratio of the second frequency division circuit arranged on an input stage of the peripheral functional block to 1/N via the control means,
   wherein N is a positive integer.

6. A method according to claim 5, further comprising:
   in order to cancel the low-power consumption mode of the CPU, changing N times the frequency division ratio of the second frequency division circuit arranged on the input stage of the peripheral functional block via the control means; and
   subsequently changing N times the frequency multiplication ratio of the frequency multiplication circuit via the control means.

7. A clock control method in a clock control system, the clock control system comprising a CPU, a peripheral functional block for the CPU, a frequency multiplication circuit and a plurality of frequency division circuits that generate clocks to be used for the CPU and the peripheral functional block, and control means for controlling operations of the frequency multiplication circuit and the frequency division circuits, wherein a frequency of an input system clock is multiplied by the frequency multiplication circuit, the multiplied frequency is input to the plurality of frequency division circuits connected as first and second frequency division circuits to input stages of the CPU and the peripheral functional block, a frequency of a signal output from the frequency multiplication circuit is divided by the first frequency division circuit to supply the signal as a CPU clock to the CPU, the frequency of the signal output from the frequency multiplication circuit is divided by the second frequency division circuit to supply the signal as a peripheral functional block clock to the peripheral functional block, said method comprising, in order to set the CPU to a low-power consumption mode:
   confirming whether the peripheral functional block keeps operating, on the basis of whether the control means has received a second clock stop enable signal output from the peripheral functional block if the control means receives a first clock stop enable signal output from the CPU;
   determining that the peripheral functional block keeps operating if the control means has not received the second clock stop enable signal output from the peripheral functional block;
   changing a frequency multiplication ratio of the frequency multiplication circuit to 1/N via the control means; and
   subsequently changing a frequency division ratio of the second frequency division circuit arranged on the input stage of the peripheral functional block to 1/N via the control means,
   wherein N is a positive integer.

8. A method according to claim 7, further comprising, in order to cancel the low-power consumption mode of the CPU:
   confirming whether the peripheral functional block keeps operating, on the basis of whether the control means has received the second clock stop enable signal output from the peripheral functional block if the control means does not receive the first clock stop enable signal output from the CPU;
determining that the peripheral functional block keeps operating if the control means has not received the second clock stop enable signal output from the peripheral functional block;
changing N times the frequency division ratio of the second frequency division circuit arranged on the input stage of the peripheral functional block via the control means; and
subsequently changing N times the frequency multiplication ratio of the frequency multiplication circuit via the control means.

* * * * *